United States Patent
Honken et al.

(10) Patent No.: US 8,363,559 B2
(45) Date of Patent: Jan. 29, 2013

(54) METHOD AND SYSTEM FOR PROVIDING INFORMATION FOR RECOVERING A CLOCK FREQUENCY

(75) Inventors: Stefan Honken, Unterhaching (DE); Ronalf Kramer, Oberhaching (DE)

(73) Assignee: Lantiq Deutschland GmbH, Neubiberg (DE)

( * ) Notice: Subject to any disclaimer, the term of this patent is extended or adjusted under 35 U.S.C. 154(b) by 1892 days.

(21) Appl. No.: 11/526,541

(22) Filed: Sep. 25, 2006

(65) Prior Publication Data

US 2008/0075220 A1    Mar. 27, 2008

(51) Int. Cl.
H03D 3/24    (2006.01)
(52) U.S. Cl. .................. 370/252; 375/376
(58) Field of Classification Search .......... None
See application file for complete search history.

(56) References Cited

U.S. PATENT DOCUMENTS

| | | | |
|---|---|---|---|
| 5,754,437 A * | 5/1998 | Blazo | 702/75 |
| 6,236,343 B1 * | 5/2001 | Patapoutian | 341/111 |
| 6,404,247 B1 | 6/2002 | Wang | |
| 6,650,187 B1 * | 11/2003 | Riddle et al. | 331/17 |
| 6,816,018 B1 * | 11/2004 | Trumbo et al. | 331/1 A |
| 6,822,593 B2 | 11/2004 | Level et al. | |
| 7,538,823 B1 * | 5/2009 | Singh et al. | 348/663 |
| 7,643,595 B2 * | 1/2010 | Aweya et al. | 375/356 |
| 2003/0118143 A1 * | 6/2003 | Bellaouar et al. | 375/376 |
| 2003/0133461 A1 | 7/2003 | Ho et al. | |
| 2003/0169776 A1 * | 9/2003 | Reesor | 370/503 |
| 2004/0032922 A1 * | 2/2004 | Knapp et al. | 375/356 |
| 2004/0109520 A1 * | 6/2004 | Hsu et al. | 375/376 |
| 2004/0258188 A1 * | 12/2004 | Kim et al. | 375/376 |
| 2005/0041691 A1 * | 2/2005 | Laufer et al. | 370/503 |
| 2005/0062550 A1 * | 3/2005 | Melanson | 331/17 |
| 2005/0100054 A1 * | 5/2005 | Scott et al. | 370/503 |
| 2005/0156625 A1 | 7/2005 | Dahan | |
| 2007/0024383 A1 * | 2/2007 | Spijker et al. | 331/34 |
| 2007/0116465 A1 * | 5/2007 | Bieker | 398/70 |
| 2007/0160164 A1 * | 7/2007 | Sahota | 375/295 |
| 2007/0223459 A1 * | 9/2007 | Crowle et al. | 370/353 |
| 2007/0247234 A1 * | 10/2007 | Roper | 331/16 |

FOREIGN PATENT DOCUMENTS

| | | |
|---|---|---|
| GB | 2 421 141 A | 6/2006 |
| WO | WO 00/28666 A1 | 5/2000 |

* cited by examiner

*Primary Examiner* — Hassan Phillips
*Assistant Examiner* — Duc Duong
(74) *Attorney, Agent, or Firm* — Eschweiler & Associates, LLC

(57) ABSTRACT

A method and a system for providing information for recovering a clock frequency via a data network comprise generating a value representative of a frequency difference between a clock frequency and a reference frequency by using a digital phase-locked loop at an ingress interface of a data network, transmitting the generated value over the data network, and recovering the clock frequency at an egress interface of the data network by using the reference frequency and the transmitted value. Other systems and methods are also disclosed.

6 Claims, 6 Drawing Sheets

METHOD AND SYSTEM FOR PROVIDING INFORMATION FOR RECOVERING A CLOCK FREQUENCY

FIELD OF THE INVENTION

The present invention relates to data networks and more particularly to recovering a clock frequency via a data network.

BACKGROUND OF THE INVENTION

In recent years, different types of communication networks have been developed to carry various types of information. Communication networks typically make use of one of two well established transmission mechanisms, namely the circuit switched transfer and the packet switched transfer. The older networks like telephone networks for voice communication are primarily circuit switched networks. In a circuit switched network, each call establishes a dedicated point-to-point-connection through the network which, for instance, allows people at both ends of a telephone call to speak and listen at the same time.

A circuit remains open for the entire duration of a call even if no one is speaking, which means that a significant amount of circuit's bandwidth, or capacity to carry information, is wasted on silence. In order to utilize the capacity more efficiently, circuit switched telecommunication networks have made use of time division multiplexed (TDM) circuits to interconnect network switches. In TDM, analog signals are digitally coded and multiplexed in time over circuits at a constant bit rate.

The wide spread use of computers in the last decades has led to the development of additional types of networks. These networks have been configured for the purpose of data communications and are primarily packet switched networks. In a packet switched network, a call may consist of a stream of data sent from one computer to another. The stream of data is divided up into packets before it enters the network. At the destination, the stream of data is re-assembled from the packets. Thus packet switched networks typically do not allocate fixed resources to transmitters, but rather route packets of data on a best efforts basis using destination address information contained in packet headers, and network switches and routers.

A packet switched call therefore does not require a dedicated connection through the network. Instead, packets from many different calls can share the same bandwidth. That is, packets from one call can be inserted into spaces between packets from other calls. For these reasons, packet switched networks efficiently utilize much more network bandwidth than circuit switched networks, making packet switched networks particularly suited to handle large volumes of data.

Packet switched networks are becoming more popular amongst network operators as they often provide better performance, and are more cost effective to install and maintain than equivalent circuit switched networks. Moreover, for the above-mentioned reasons of performance and cost, many operators and leased line providers who provide bandwidth to service providers are moving towards replacing TDM sources with packet networks. In many cases, switch to switch communications will be provided entirely over packet networks. However, it is likely that for many years to come, some operators will continue to rely upon TDM circuits to provide all or at least a part of the networks. This will bring about a constant need for interworking methods and systems between packet networks and TDM systems Packet switched networks, however, normally do not work well for time critical transmissions such as voice. For instance, in packet switched networks, packets may experience delay variations while traveling through the network. As a result, packets are rarely received at a constant bit rate. In data communications, delay variations between packets usually do not matter. A computer can just wait for a complete set of packets to arrive before processing the data. For time critical transmissions, however, delay variations can have a significant impact on the quality of the call. In such case, circuit switched networks like TDM are generally better suited for constant bit rate, time critical transmissions such as voice communication.

In general, TDM links are synchronized circuits with a constant (transmission) bit rate governed by a service clock operating at some pre-defined frequency. In contrast, in a packet network there is no direct link between the frequency at which packets are sent from an ingress port of the network and the frequency at which they arrive at an egress port of the network. In order to provide a TDM circuit emulation, there must be provided at the ports of the packet network an interworking between the TDM links and the packet network in such a way that the TDM link at the ingress side is synchronized with the TDM link at the egress side. That is to say that the TDM service frequency at the customer premises on the ingress side must be exactly reproduced at the egress side of the packet network. The consequence of any long-term mismatch in these frequencies will be that the queue, for example, in a buffer memory etc., at the egress of the packet network will either fill up or empty, depending upon on whether the regenerated clock is slower or faster than the original clock, causing loss of data and degradation of the service. Also, unless the phase of the original clock is tracked by that of the regenerated clock, a lag in frequency tracking will result in small but nonetheless undesirable changes to the operating level of the queue at the egress.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Various embodiments of the present invention relate to a method of providing an information for recovering a clock frequency via a data network, a method of providing an information for recovering a clock frequency to a data network, a method of generating a value representative of a frequency difference between a clock frequency and a reference frequency, a system for providing an information for recovering a clock frequency via a data network, an apparatus for providing an information for recovering a clock frequency to a data network, and a digital phase-locked loop.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

Embodiments of the invention are better understood with reference to the following drawings.

DETAILED DESCRIPTION OF THE INVENTION

Figure 1:
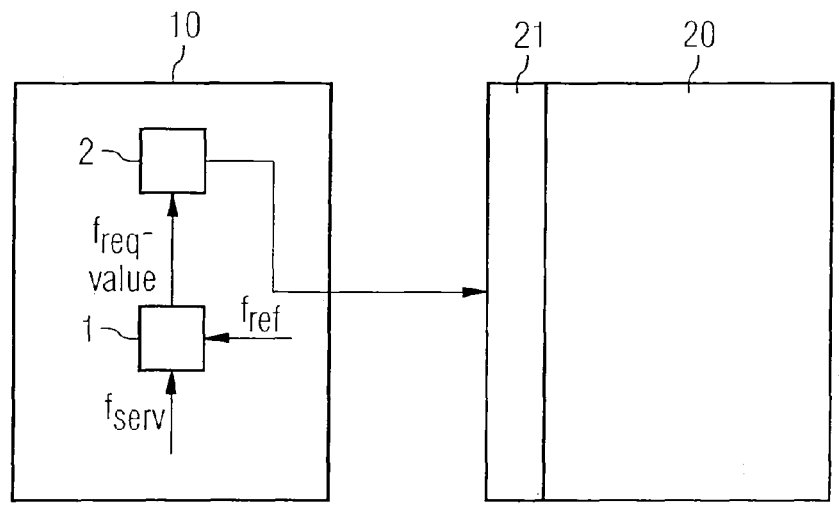
FIG. 1 is a block diagram for illustrating an embodiment of an apparatus according to the present invention.

Embodiments of the invention are described with reference to the drawings, wherein like reference numerals are generally utilized to refer to like elements throughout. In the following description for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of the specific details. In other instances, known structures and devices are shown in block diagram form in order to facilitate describing one or more aspects of the embodiments of the invention. The following description is therefore not to be taken in a limiting sense, and the scope of the invention is defined by the appended claims.

Referring to FIG. 1 there is shown a block diagram for illustrating an embodiment of an apparatus according to the present invention. The apparatus comprises a digital phase-locked loop 1 which is integrated within the environment of a transmission entity 10, for example, at a customer premises. The transmission entity 10 can be, for example, a TDM transmission entity. The digital phase-locked loop 1 comprises a first input for receiving a first signal having a clock frequency fserv which is the service clock frequency of the TDM transmission entity 10, and a second input for receiving a second signal having a reference frequency fref. The digital phase-locked loop 1 generates a value, in particular a digital value, representative of a frequency difference between the clock frequency fserv and the reference frequency fref. The apparatus also comprises a transmitting device 2 for transmitting the generated value to an ingress interface 21 of a data network 20. The transmitting device 2 may, for example, transmit the generated value to connection lines which connect the transmitting device 2 with an output port of the transmission entity 10 and the output port of the transmission entity 10 with the ingress interface 21 of the data network 20. The transmitting device 2 may, for example, also serve for transmitting TDM data like e.g. payload data from the transmission entity 10 to the data network 20 and as well the connection lines may, for example, be used also for transmitting TDM data like payload data from the TDM transmission entity 10 to the data network 20. In one embodiment, the data network 20 can be, for example, a packet switched network.

Figure 2:
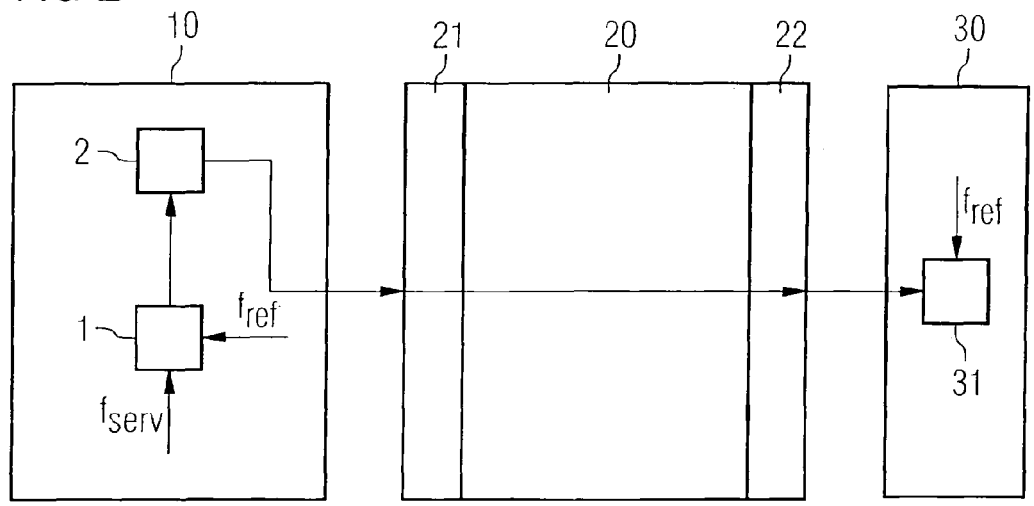
FIG. 2 is a block diagram for illustrating an embodiment of a system according to the present invention.

Referring to FIG. 2, there is shown a block diagram for illustrating an embodiment of a system according to the present invention. The system comprises a digital phase-locked loop 1 integrated within the environment of a TDM transmission entity 10. As already described in connection with FIG. 1, the digital phase-locked loop 1 generates a value representative of a frequency difference between a clock frequency fserv and a reference frequency fref and transmitting device 2 to transmit the generated value to an ingress interface 21 of a data network 20. The system further comprises a recovering device 31 integrated within the environment of a reception entity 30 wherein the recovering devices 31 are coupled to an egress interface 22 of the data network 20. The recovering devices 31 comprise a first input for inputting the reference frequency fref and a second input coupled to the egress interface 22 of the data network 20. In the recovering device 31, the clock frequency fserv is recovered by use of the supplied reference frequency fref and the transmitted value which is representative of the frequency difference between the clock frequency fserv and the reference frequency fref. The reception entity 30 can be, for example, a TDM reception entity. The interfaces 21 and 22 may comprise interworking function blocks that provide for rate adaptation and protocol conversion.

Figure 3:
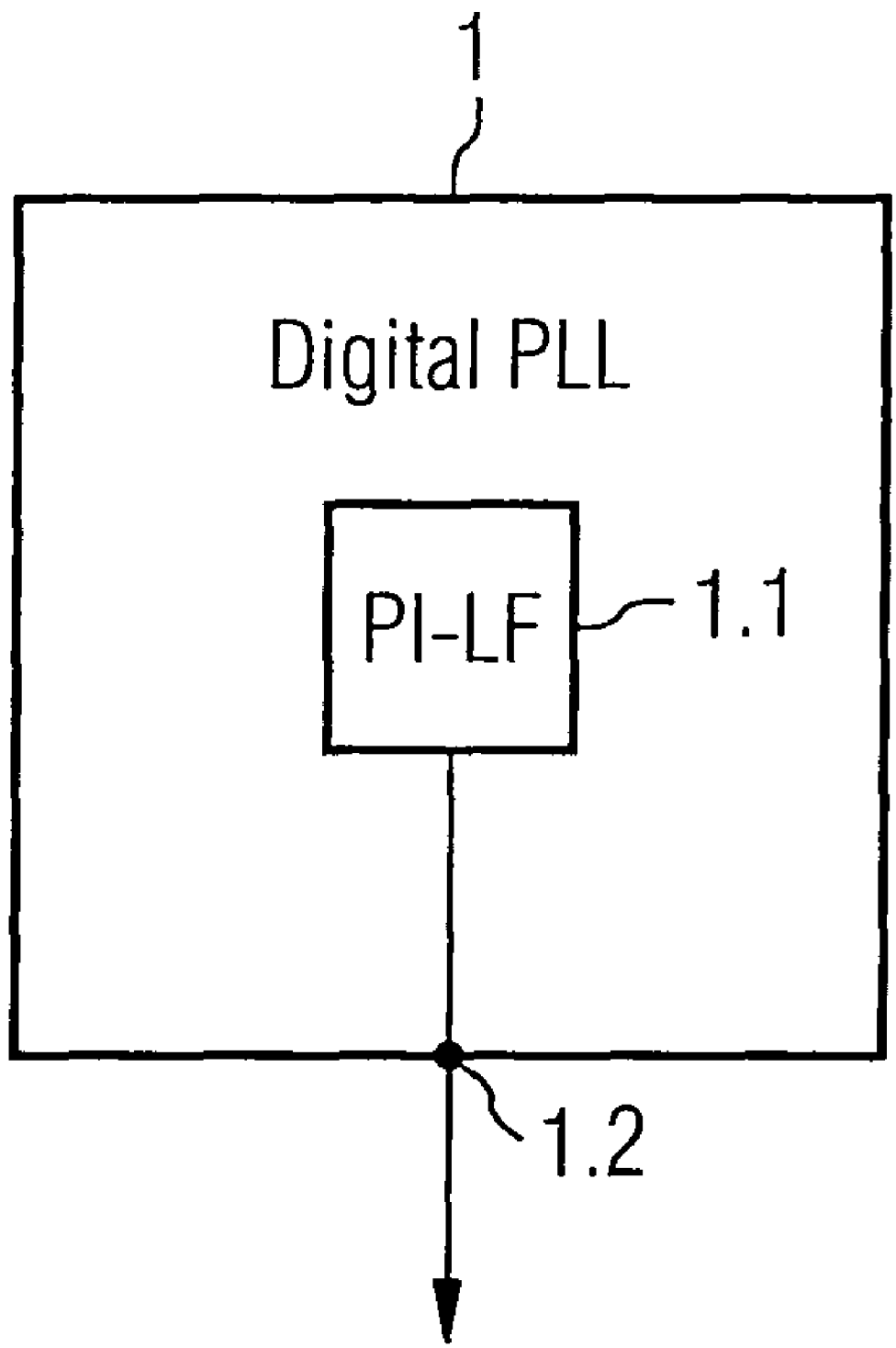
FIG. 3 is a block diagram for illustrating an embodiment of a digital phase-locked loop according to the present invention.

Referring to FIG. 3, there is shown a block diagram for illustrating an embodiment of a digital phase-locked loop according to the present invention. The digital phase-locked loop 1 comprises a proportional-integral (PI) loop filter 1.1 and an output 1.2, coupled to the PI loop filter 1.1, for outputting an integral term of the loop filter 1.1. In another embodiment, instead of using a PI loop filter 1.1 a proportional-integral-differential (PID) loop filter 1.1 may be used.

Figure 4:
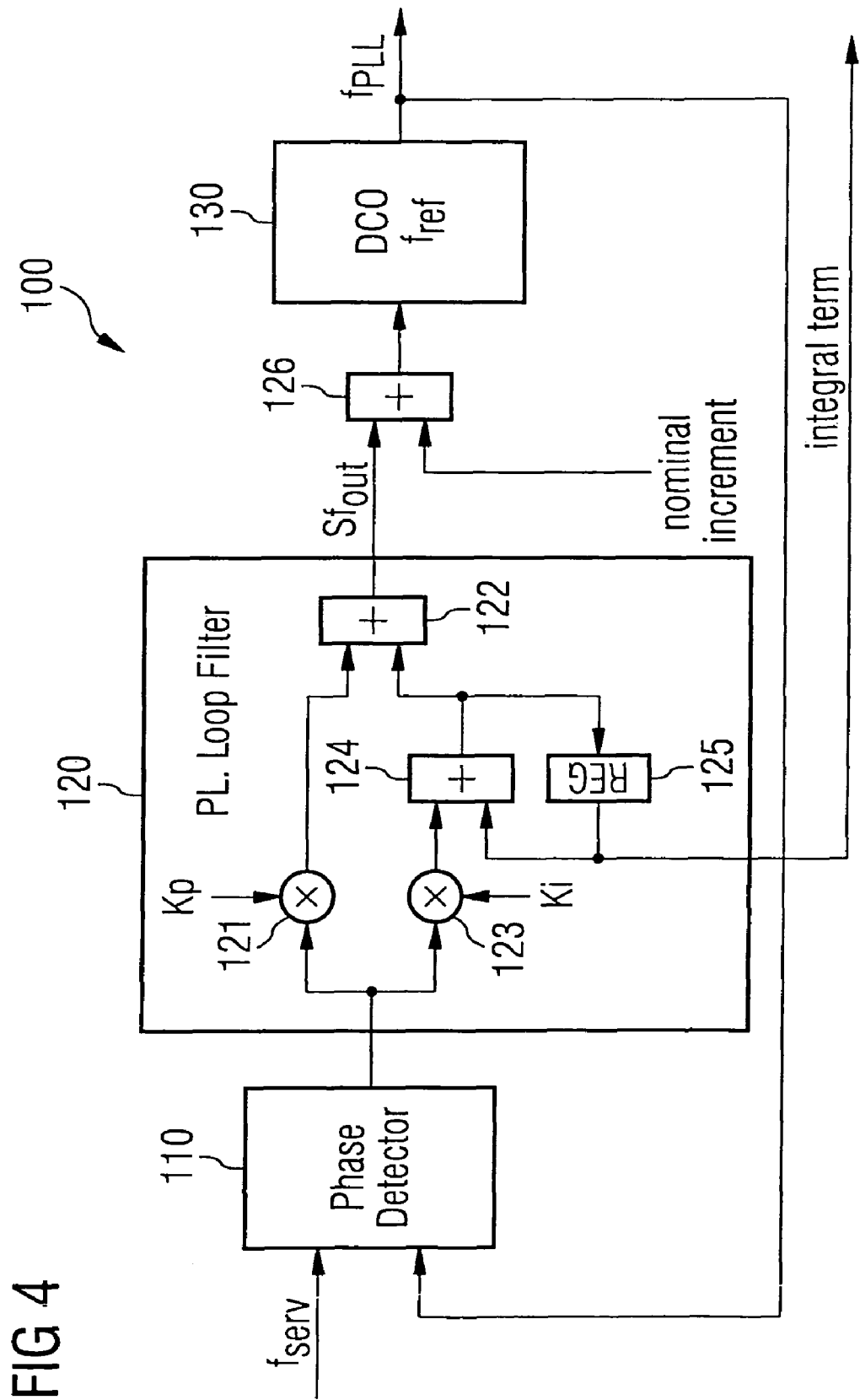
FIG. 4 is a block diagram for illustrating a further embodiment of an apparatus according to the present invention and a digital phase-locked loop according to the present invention.

Referring to FIG. 4, there is shown a block diagram for illustrating an apparatus according to a further embodiment of the present invention and a digital phase-locked loop according to the present invention. The digital phase-locked loop 100 as shown in FIG. 4 comprises a phase detector 110, a proportional-integral (PI) loop filter 120 and a digitally controlled oscillator (DCO) 130. The phase detector 110 comprises two inputs for inputting the service clock frequency fserv and the output frequency fpll of the digital phase-locked loop 100. An output of the phase detector 110 is coupled to an input of the PI loop filter 120. The PI loop filter 120 comprises a proportional part and an integral part wherein the output signal of the phase detector 110 is supplied to both the proportional part and the integral part. The proportional part comprises a first multiplier 121 and the integral part comprises a second multiplier 123, a first adder 124 and a regulator 125. The output signal of the phase detector 110 is supplied to the first multiplier 121 where it is multiplied with a value Kp. The output signal of the first multiplier 121 is supplied to the first input of a second adder 122. The output signal of the phase detector 110 is also supplied to the second multiplier 123 where it is multiplied with a value Ki. The output of the second multiplier 123 is supplied to a first input of the first adder 124. The output of the first adder 124 is supplied to the second input of the second adder 122. The output of the first adder 124 is also supplied to the input of the regulator 125 and the output of the regulator 125 is supplied to the second input of the first adder 124. An output signal sfout of the PI loop filter 120, which is an output signal of the second adder 122, is supplied to a first input of a third adder 126 and a nominal increment is supplied to a second input of the third adder 126. An output of the third adder 126 is supplied to an input of the DCO 130.

In operation, the digital phase-locked loop 100 will become synchronized to the service clock frequency fserv as set forth below. In an unlocked state of the digital PLL 100 the output frequency fpll will be designated as fservnom. This frequency is derived directly from the reference frequency fref supplied to the DCO 130. In a locked state of the digital PLL 100 the output of the DCO 130 will be the synchronized service clock frequency fservsync wherein fservsync=fserv. The frequency difference between fservnom and fserv can be derived from the integral term of the PI loop filter 120. The thus determined difference information which is a digital value is transmitted via the data network and can be used on the egress entity of the data network to recover the service clock frequency fserv on the basis of the reference frequency fref which is available on both sides on the data network.

When using a DCO 130 for the generation of the output frequency within the digital PLL 100 the frequency of the free running DCO 130 must be in synchronism with the reference frequency fref. If the output signal sfout=0 then the output frequency of the PLL 100 is fservnom which is in synchronism with the reference frequency fref.

Figure 5:
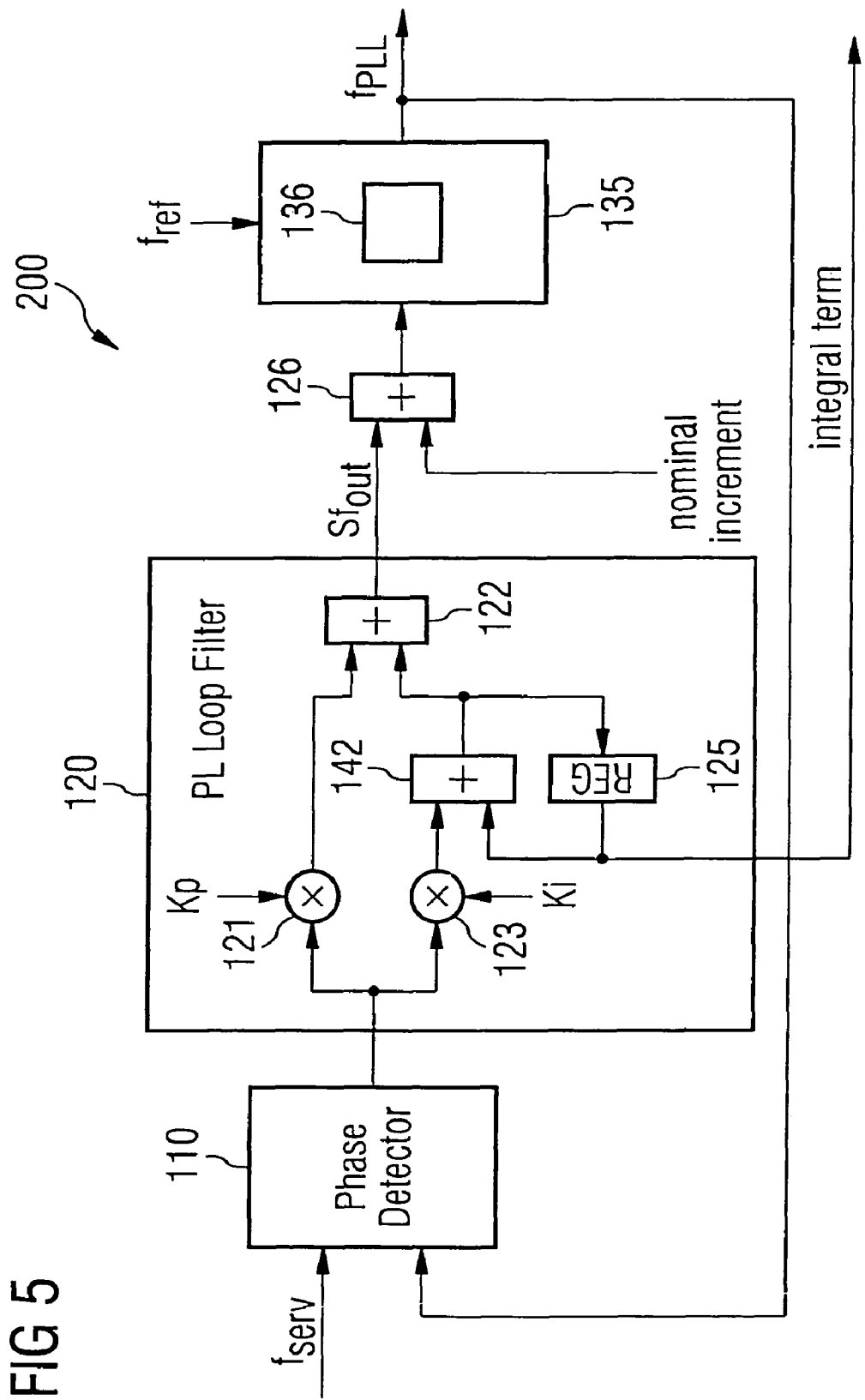
FIG. 5 is a block diagram for illustrating a further embodiment of an apparatus and a digital phase-locked loop according to the present invention.

Referring to FIG. 5, there is shown a block diagram for illustrating one embodiment of an apparatus according to the present invention and a digital phase-locked loop according to the present invention. Digital PLL 200 is similar to the PLL as depicted in FIG. 4 except that the DCO 130 of the digital PLL 100 of FIG. 4 is replaced by a frequency synthesizer 135 in the digital PLL 200 as depicted in FIG. 5. The frequency synthesizer 135 comprises a sigma-delta-modulator 136 and can be constructed in the same way as disclosed in the International (PCT) Patent Application No. PCT/DE99/03580, Publication No. WO 00/28666, the contents of which are herewith incorporated by reference. The frequency synthesizer 135 which is based on the sigma-delta-modulator 136 is used to generate the output frequency fpll of the digital PLL 200 which in operation will become synchronized to the service clock frequency fserv.

Figure 6:
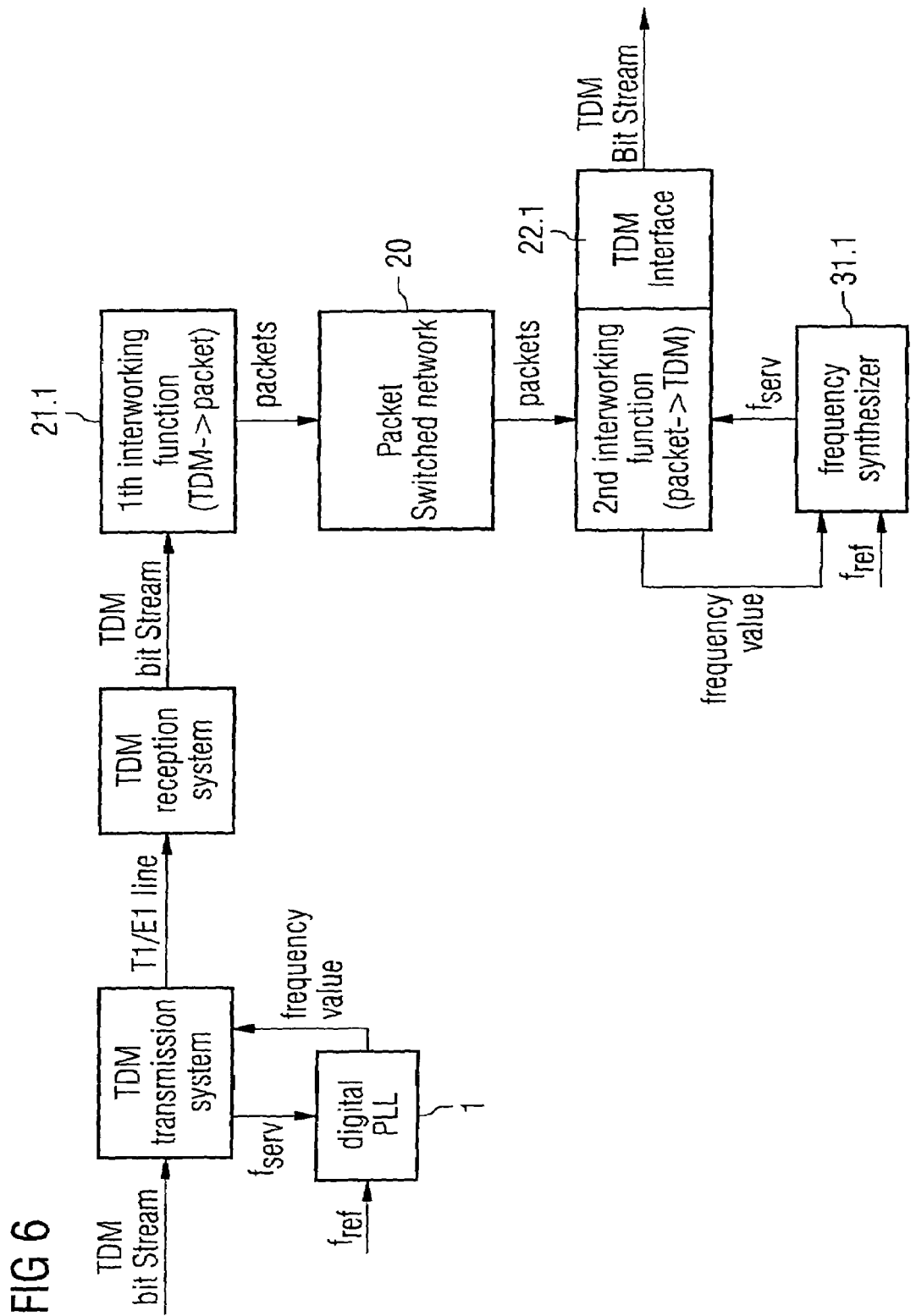
FIG. 6 is a block diagram for illustrating a further embodiment of a system according to the present invention.

Referring to FIG. 6, there is shown a block diagram for illustrating a further embodiment of a system according of the present invention. A TDM bit stream is supplied to a TDM transmission system which is connected to a digital phase-locked loop (PLL) 1. A service clock frequency fserv is supplied to the digital PLL 1 by the TDM transmission system. A reference frequency fref is also supplied to the digital PLL 1. The digital PLL 1 synchronizes to the service clock frequency fserv and generates a value which corresponds to the frequency difference between the clock frequency fserv and the reference frequency fref. The value corresponding to the frequency difference is transmitted from the digital PLL 1 to the TDM transmission system. From the TDM transmission system transmission data like e.g. payload data are transmitted on a transmitting line such as a T1/E1 line to a TDM reception system. On the same transmitting line, the value corresponding to the frequency difference is also transmitted from the TDM transmission system to the TDM reception system. The TDM transmission system, the digital PLL 1, and the TDM reception system form together a TDM transmission entity 10 as depicted in FIGS. 1 and 2.

From the TDM reception system a TDM bit stream is transmitted to a first interworking function block 21.1 which contains hardware and/or software elements that provide a rate adaptation and protocol conversion from the TDM system to the packet switched network 20. The first interworking function block 21.1 converts the TDM bit stream into a stream of data packets and sends the stream of data packets into the packet switched network 20 wherein each data packet contains a header carrying an information about the destination of the respective data packet. At the destination entity the data packets are extracted from the packet switched network 20 and supplied to a second interworking function block 22.1 which contains hardware and/or software elements that provide the rate adaptation and protocol conversion between the packet switched network 20 and the TDM system. The second interworking function block 22.1 converts the data packets into a TDM bit stream which is output by a TDM interface coupled to the second interworking function block 22.1. The second interworking function block 22.1 is coupled to a frequency synthesizer 31.1 which receives the value corresponding to the frequency difference from the second interworking function block 22.1 and which is also supplied with the reference frequency fref. The frequency synthesizer 31.1 comprises, for example, a digitally controlled oscillator which is supplied with the reference frequency fref and the value corresponding to the frequency difference. The frequency synthesizer 31.1 synchronizes to the service clock frequency fserv and forwards the same to the second interworking function block.

Figure 7:
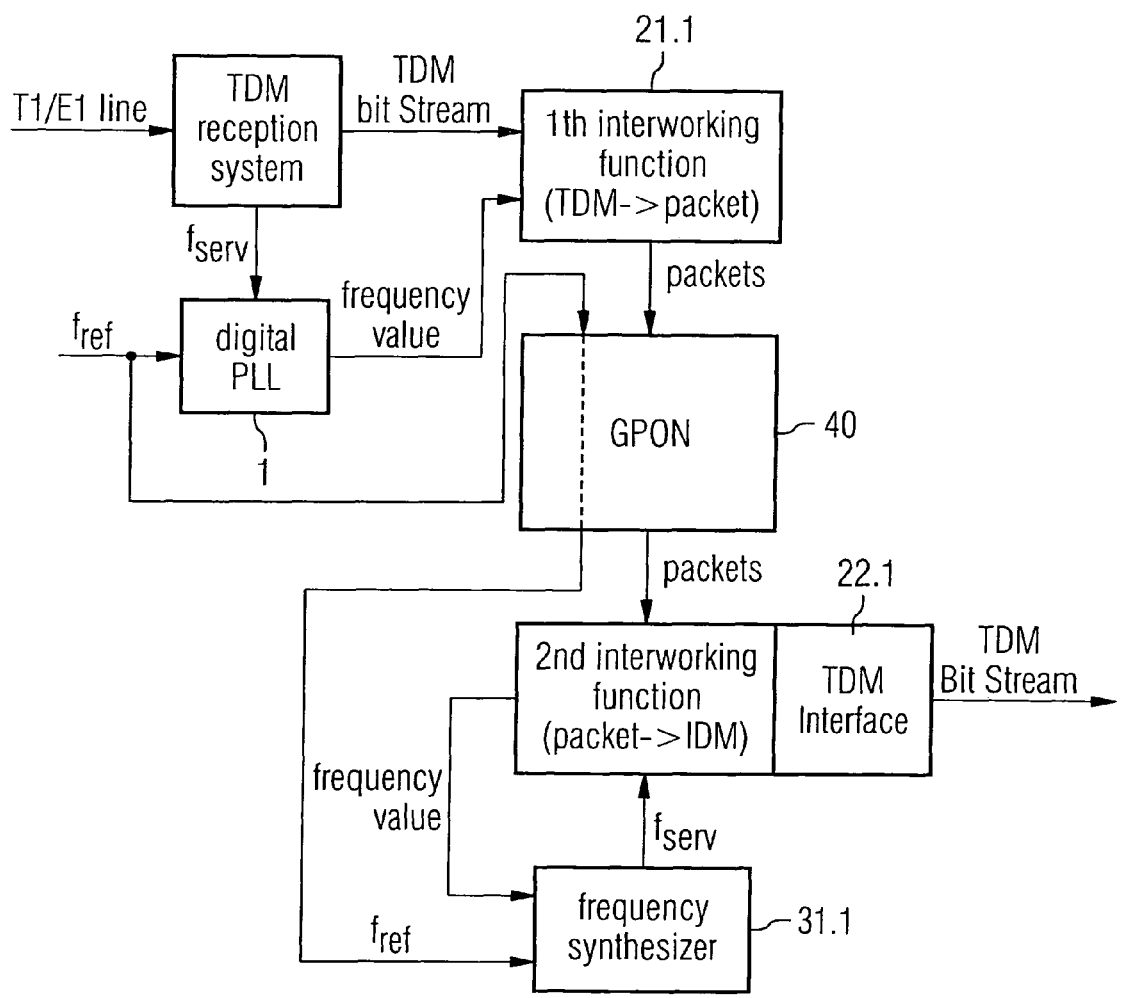
FIG. 7 is a block diagram for illustrating a further embodiment of a system according to the present invention.

Referring to FIG. 7, there is shown a further embodiment for illustrating a system according to the present invention. This embodiment is similar to the embodiment as depicted in FIG. 6 besides the fact that the packet switched network of the embodiment of FIG. 6 is replaced by a Gigabit Passive Optical Network (GBON) 40. An input of a TDM reception system is coupled with a transmitting line such as a T1/E1 line for receiving a TDM bit stream. The TDM reception system is also coupled to a digital PLL 1. A service clock frequency fserv is supplied to the digital PLL 1 by the TDM reception system. A reference frequency fref is also supplied to the digital PLL 1. The digital PLL 1 synchronizes to the service clock frequency fserv and generates a value which corresponds to the frequency difference between the clock frequency fserv and the reference frequency fref. The value corresponding to the frequency difference is transmitted from the digital PLL 1 to a first interworking function block 21.1. The reception system and the digital PLL 1 form together a TDM transmission entity 10 as depicted in FIGS. 1 and 2.

A TDM bit stream is transmitted from the TDM reception system to the first interworking function block 21.1 which contains hardware and/or software elements that provide a rate adaptation and protocol conversion from the TDM system to the GPON 40. The first interworking function block 21.1 converts the TDM bit stream into a stream of data packets and sends the stream of data packets into the GPON 40 wherein each data packet contains a header carrying an information about the destination of the respective data packet. At the destination entity the data packets are extracted from the GPON 40 and supplied to a second interworking function block 22.1 which contains hardware and/or software elements that provide the rate adaptation and protocol conversion between the GPON 40 and the TDM system. The second interworking function block 22.1 converts the data packets into a TDM bit stream which is output by a TDM interface coupled to the second interworking function block 22.1. The second interworking function block 22.1 is coupled to a frequency synthesizer 31.1 which receives the value corresponding to the frequency difference from the second interworking function block 22.1 and which is also supplied with the reference frequency fref. The reference frequency fref may be transmitted through the GPON 40, as indicated by the dashed line. The frequency synthesizer 31.1 comprises, for example, a digitally controlled oscillator which is supplied with the reference frequency fref and the value corresponding to the frequency difference. The frequency synthesizer 31.1 synchronizes to the service clock frequency fserv and forwards the same to the second interworking function block 22.1.

Embodiments of the present invention may be used whenever data of a synchronous system, in particular TDM data, are transmitted over an asynchronous packet switched network. The value corresponding to the frequency difference can, for example, be generated at the source of a communication service such as a T1/E1 service. For this purpose the same digital PLL can be used which is already present for the generation of the communication clock signal such as a T1/E1 transmission clock signal. Alternatively another digital PLL can be implemented which is only used for the generation of the value corresponding to the frequency difference.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A system, comprising:
   a time domain multiplexing (TDM) transmission entity comprising: a first TDM transmission system to transmit a TDM bitstream over a T-carrier or E-carrier line according to a TDM service clock, a first TDM reception system to receive the TDM bitstream over the T-carrier or E-carrier line according to the TDM service clock, and a digital phase-locked loop to generate a digital value representative of a frequency difference between the TDM service clock frequency and a reference frequency; and
   a first interworking function element to convert the TDM bitstream to a series of packets and transmit the series of packets over an asynchronous network along with the generated digital value according to the reference frequency.

2. The system of claim 1, further comprising:
   a TDM reception entity coupled to the first interworking function element via the asynchronous network, the TDM reception entity comprising: a second interworking function element to receive the series of packets and extract the digital value therefrom, a frequency synthesizer to recover the TDM service clock from the extracted digital value and the reference frequency, wherein the second interworking function element is configured to recover the TDM bitstream based on the series of packets and the TDM service clock.

3. The system of claim 1, wherein the asynchronous network comprises a packet-switched network.

4. The system of claim 1, wherein the asynchronous network comprises a gigabit passive optical network (GBON).

5. The system of claim 1, wherein the digital phase-locked loop comprises a proportional-integral control loop or a proportional-integral-differential control loop, and wherein the transmitted digital value corresponds an integral term of the proportional-integral control loop or the proportional-integral-differential control loop.

6. The system of claim 1, wherein the digital phase-locked loop (PLL) comprises an integral part having an input coupled to an input of the digital PLL and an output coupled to a first input of a first adder; a control loop to couple an output of the first adder to a second input of the first adder; a proportional part having an input coupled to the input of the PLL and having an output coupled to a first input of a second adder; the second adder having a second input coupled to the output of the first adder.

* * * * *